US012808055B2

(12) United States Patent
Susa et al.

(10) Patent No.: US 12,808,055 B2
(45) Date of Patent: Nov. 24, 2026

(54) METHODS OF FILLING RECESSES ON SUBSTRATE SURFACE, STRUCTURES FORMED USING THE METHODS, AND SYSTEMS FOR FORMING SAME

(71) Applicant: ASM IP Holding B.V., Almere (NL)

(72) Inventors: Yoshio Susa, Tama (JP); Hirotsugu Sugiura, Tama (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 336 days.

(21) Appl. No.: 17/591,070

(22) Filed: Feb. 2, 2022

(65) Prior Publication Data

US 2022/0251707 A1 Aug. 11, 2022

Related U.S. Application Data

(60) Provisional application No. 63/146,326, filed on Feb. 5, 2021.

(51) Int. Cl.

| | |
|---|---|
| ***C23C 16/513*** | (2006.01) |
| ***C23C 16/26*** | (2006.01) |
| ***C23C 16/32*** | (2006.01) |
| ***C23C 16/34*** | (2006.01) |
| ***C23C 16/40*** | (2006.01) |
| ***C23C 16/56*** | (2006.01) |
| *H10P 14/60* | (2026.01) |
| *H10P 14/69* | (2026.01) |
| *H10P 14/692* | (2026.01) |
| *H10P 14/694* | (2026.01) |

(52) U.S. Cl.

CPC ............ *C23C 16/513* (2013.01); *C23C 16/26* (2013.01); *C23C 16/325* (2013.01); *C23C 16/34* (2013.01); *C23C 16/401* (2013.01); *C23C 16/56* (2013.01); *H10P 14/6905* (2026.01); *H10P 14/6532* (2026.01); *H10P 14/6902* (2026.01); *H10P 14/69215* (2026.01); *H10P 14/69433* (2026.01)

(58) Field of Classification Search

CPC ..... C23C 16/513; C23C 16/26; C23C 16/325; C23C 16/34; C23C 16/401; C23C 16/56

See application file for complete search history.

(56) References Cited

U.S. PATENT DOCUMENTS

| | | | |
|---|---|---|---|
| 6,436,813 B1 | 8/2002 | Oikawa et al. | |
| 6,627,532 B1 | 9/2003 | Gaillard et al. | |
| 9,534,140 B2 | 1/2017 | Ohashi et al. | |
| 10,388,513 B1 | 8/2019 | Blanquart | |
| 11,972,944 B2 | 4/2024 | Blanquart | |
| 2014/0045342 A1* | 2/2014 | Mallick ............ | H01L 21/02115 438/778 |
| 2015/0104954 A1 | 4/2015 | Pore | |

(Continued)

OTHER PUBLICATIONS

Cheung et al. "Plasma immersion ion implantation for semiconductor processing" Materials Chemistry and Physics 46 (1996) 132-139. (Year: 1996).*

*Primary Examiner* — Robert S Walters, Jr.

(74) *Attorney, Agent, or Firm* — Snell & Wilmer L.L.P.

(57) ABSTRACT

Methods and systems for forming a structure and structures formed using the methods or systems are disclosed. Exemplary methods include depositing material on a surface of the substrate and treating the deposited material to form treated material. The methods can be used to fill recesses on a surface of a substrate.

18 Claims, 9 Drawing Sheets

(56) References Cited

U.S. PATENT DOCUMENTS

| | | | | |
|---|---|---|---|---|
| 2017/0271196 | A1* | 9/2017 | Manna | H01L 21/76283 |
| 2018/0148832 | A1* | 5/2018 | Chatterjee | C23C 16/26 |
| 2019/0237325 | A1 | 8/2019 | Wang | |
| 2019/0333760 | A1* | 10/2019 | Kalutarage | C23C 16/56 |
| 2019/0385907 | A1 | 12/2019 | Gottheim | |
| 2019/0393030 | A1* | 12/2019 | Jiang | C23C 16/50 |
| 2020/0013612 | A1* | 1/2020 | Blanquart | H01L 21/76837 |
| 2020/0013613 | A1 | 1/2020 | Blanquart | |
| 2020/0365391 | A1 | 11/2020 | Blanquart | |
| 2021/0020431 | A1 | 1/2021 | Blanquart | |
| 2021/0028055 | A1* | 1/2021 | Manna | H01L 21/76224 |
| 2021/0151348 | A1 | 5/2021 | Utsuno | |
| 2021/0225642 | A1 | 7/2021 | Utsuno | |
| 2021/0238742 | A1* | 8/2021 | Susa | H01L 21/02274 |
| 2021/0366712 | A1 | 11/2021 | Susa | |

* cited by examiner

| Functional Group | Aldehyde | Ketone | Carboxylic | Ester |
|---|---|---|---|---|
| Formula | RCHO | RCOR' | RCOOH | RCOOR' |
| |  |  |  |  |

| Functional Group | Amide | Encone | Acyl chloride | Acid anhydride |
|---|---|---|---|---|
| Formula | RC(O)C(R')CR"R" | RC(O)C(R')CR'R" | RCOCl | (RCO)2O |
| |  |  |  |  |

METHODS OF FILLING RECESSES ON SUBSTRATE SURFACE, STRUCTURES FORMED USING THE METHODS, AND SYSTEMS FOR FORMING SAME

CROSS-REFERENCE TO RELATED APPLICATIONS

This application claims the benefit of and priority to U.S. Provisional Patent Application Ser. No. 63/146,326 filed Feb. 5, 2021, the disclosure of which is hereby incorporated by reference in its entirety.

FIELD OF INVENTION

The present disclosure generally relates to methods of forming structures suitable for use in the manufacture of electronic devices. More particularly, examples of the disclosure relate to methods of forming structures that include a deposited material layer that can be used to fill recesses on a surface of the structure, to structures including such layers, and to systems for performing the methods and/or forming the structures.

BACKGROUND OF THE DISCLOSURE

During the manufacture of devices, such as semiconductor devices, it is often desirable to fill features or recesses (e.g., trenches or gaps) on the surface of a substrate with insulating or dielectric material. Some techniques to fill recesses include the deposition of a layer of flowable material, such as flowable carbon material.

Although use of flowable carbon material to fill features can work well for some applications, filling features using traditional deposition techniques of flowable carbon can have several shortcomings, particularly as the size of the recesses to be filled decreases. For example, the flowable carbon films may not exhibit desired thermal stability (e.g., lack of shrinkage), density, hardness, modulus, and/or etch selectivity relative to other materials.

As device and feature sizes continue to decrease, it becomes increasingly difficult to apply conventional flowable carbon material deposition techniques to manufacturing processes, while obtaining desired fill capabilities and material properties. Accordingly, improved methods for forming structures, particularly for methods of filling recesses on a substrate surface with material, that mitigate void formation in the deposited material and/or that provide desired material properties are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures suitable for use in the formation of electronic devices. While the ways in which various embodiments of the present disclosure address drawbacks of prior methods and structures are discussed in more detail below, in general, exemplary embodiments of the disclosure provide improved methods for forming structures that include deposited material suitable for filling recesses on a substrate surface, structures including the deposited material, and systems for performing the methods and/or forming the structures. As described in more detail below, the deposited material can be exposed to or treated using heat and/or a plasma process to cause the deposited material to flow. Exemplary methods provided below provide structures with void-less recess fill, while also providing recess fill material with desired properties, such as density, thermal stability, hardness, modulus and/or etch selectivity (e.g., compared to silicon oxide, silicon nitride, silicon, and/or metal).

In accordance with various embodiments of the disclosure, a method of filling a recess on a surface of a substrate is provided. The method includes providing a substrate within a reaction chamber, depositing material on a surface of the substrate, and after depositing a sufficient amount of the deposited material to fill the recess, exposing the deposited material to a post-deposition treatment to cause the deposited material to flow within the recess. The deposited material can be or include one or more of carbon, silicon oxide, silicon nitride, and silicon carbide. In accordance with examples of the disclosure, the step of depositing material includes flowing a precursor into the reaction chamber; and exposing the precursor to a plasma to form deposited material. The post-deposition treatment can include heating the substrate (sometimes referred to as annealing) to cause the deposited material to flow. In these cases, the substrate can be heated to a temperature of, for example, about 50° C. to about 800° C. Additionally or alternatively, the post-deposition treatment can include a plasma treatment. The plasma treatment can include, for example, exposing inert gas and/or a nitrogen-containing gas to a plasma. A temperature of the substrate during a plasma treatment can be, for example, about 50° C. to about 800° C. In accordance with further examples of these embodiments, the precursor can include a cyclic structure and/or a carbonyl functional group. The carbonyl group may facilitate reflow of the deposited material during a treatment step.

In accordance with additional examples of the disclosure, a method of filling a recess on a surface of a substrate includes providing a substrate within a reaction chamber, depositing material on a surface of the substrate, and exposing the deposited material to a post-deposition treatment to cause the deposited material to flow within the recess. In these cases, the precursor includes a cyclic structure and at least one carbonyl functional group. The post-deposition treatments can be the same or similar to the post-deposition treatment described above and elsewhere herein.

In accordance with yet further exemplary embodiments of the disclosure, a structure is formed, at least in part, according to a method described herein. The structure can include a deposited or treated material layer that exhibits desired properties, such as thermal stability, density, hardness, modulus, etch selectivity, and/or the like.

In accordance with yet further exemplary embodiments of the disclosure, a system is provided for performing a method and/or for forming a structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
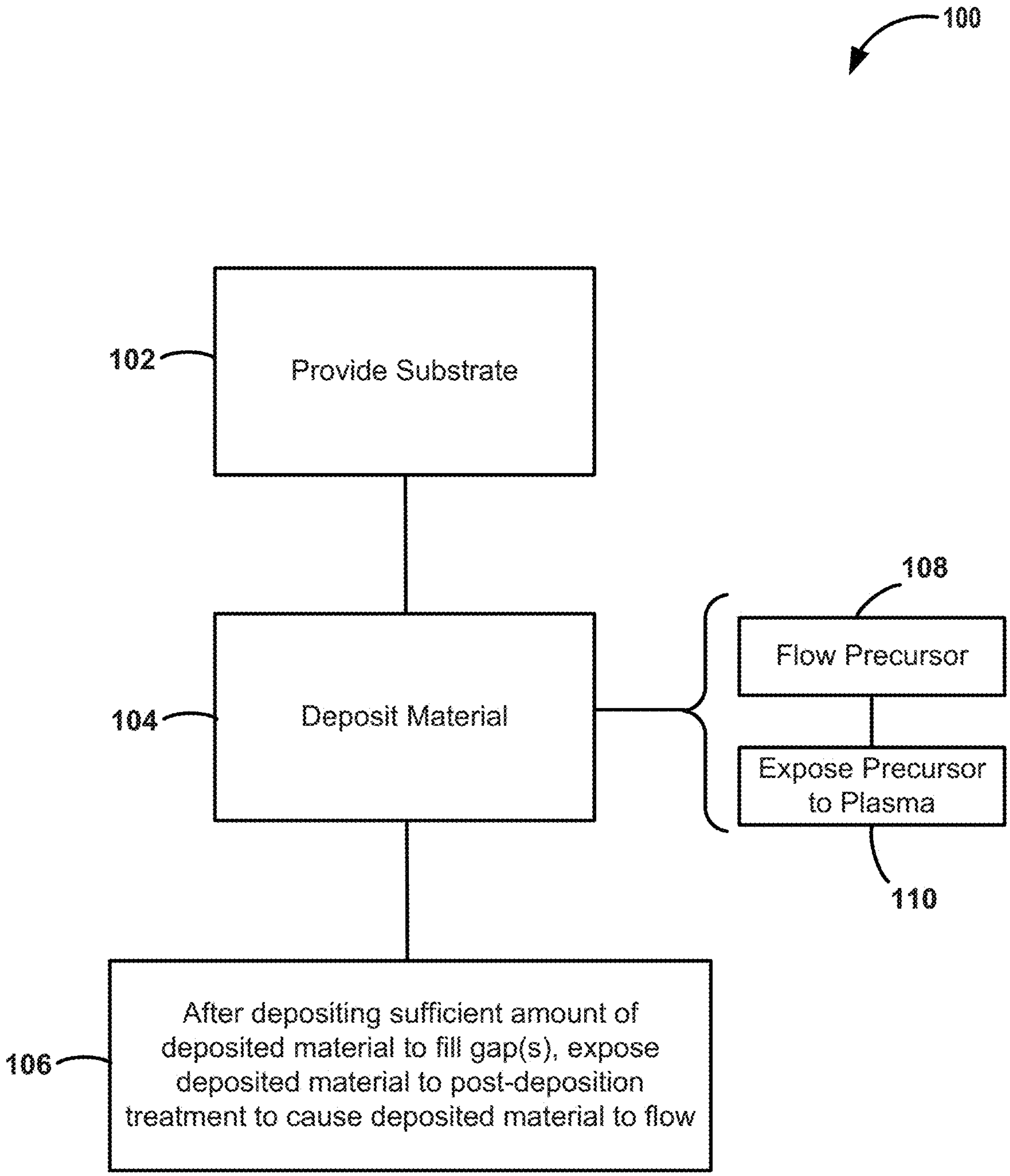
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of depositing materials, to methods of filling a recess on a surface of a substrate, to methods of forming structures, to structures formed using the methods, and to systems for performing the methods and/or forming the structures. By way of examples, the methods described herein can be used to fill features or recesses, such as gaps (e.g., trenches, vias, or spaces between protrusions) on a surface of a substrate with material, such as carbon, silicon oxide, silicon nitride, and/or silicon carbide material. The terms gap and recess can be used interchangeably.

To mitigate void and/or seam formation during a gap-filling process, deposited material can be initially flowable and flow within the gap to fill or substantially fill the gap. The initially flowable material can solidify and then reflow upon further processing or treatment—e.g., a heat treatment and/or a plasma treatment as described in more detail below. As further set forth below, the initially solidified material may include voids and/or seams within the recesses. In accordance with examples of the disclosure, upon reflow of the material, the voids and/or seams are removed or are no longer visible. In addition to reflowing the deposited material, the treatment can increase a value of one or more desirable properties, such as thermal stability, hardness, modulus, and etch selectivity.

Exemplary methods and structures described herein can be used in a variety of applications, including, but not limited to, cell isolation in 3D cross point memory devices, self-aligned vias, dummy gates, reverse tone patterns, PC RAM isolation, cut hard masks, DRAM storage node contact (SNC) isolation, and the like. Further, although much of the disclosure refers to carbon deposited materials, unless otherwise noted, the disclosure is not limited to such materials.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor, for example, power (e.g., radio frequency (RF) power) is applied. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied, but unlike a reactant, it may not become a part of a film matrix to an appreciable extent.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as recesses (e.g., gaps, vias, or spaces between protrusions), lines, and the like formed on or within at least a portion of a layer or bulk material of the substrate. By way of examples, one or more features/recesses can have a width of about 10 nm to about 100 nm, a depth or height of about 30 nm to about 1,000 nm, and/or an aspect ratio of about 3 to 100.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

As used herein, the term "carbon layer" or "carbon material" can refer to a layer whose chemical formula can be represented as including carbon. Layers comprising carbon material can include other elements, such as one or more of nitrogen and hydrogen.

As used herein, the term "silicon oxide layer" or "silicon oxide material" can refer to a layer whose chemical formula can be represented as including silicon and oxygen. Layers comprising silicon oxide material can include other elements, such as one or more of nitrogen and hydrogen.

As used herein, the term "silicon nitride layer" or "silicon nitride material" can refer to a layer whose chemical formula can be represented as including silicon and nitrogen. Layers comprising silicon nitride material can include other elements, such as one or more of oxygen and hydrogen.

As used herein, the term "silicon carbide layer" or "silicon carbide material" can refer to a layer whose chemical formula can be represented as including silicon and carbon. Layers comprising silicon carbide material can include other elements, such as one or more of oxygen, nitrogen, and hydrogen.

As used herein, the term "structure" can refer to a partially or completely fabricated device structure. By way of examples, a structure can be a substrate or include a substrate with one or more layers and/or features formed thereon.

In this disclosure, "continuously" can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

A flowability (e.g., an initial flowability) can be determined as follows:

TABLE 1

| bottom/top ratio (B/T) | Flowability |
|---|---|
| $0 < B/T < 1$ | None |
| $1 \le B/T < 1.5$ | Poor |
| $1.5 \le B/T < 2.5$ | Good |
| $2.5 \le B/T < 3.5$ | Very good |
| $3.5 \le B/T$ | Extremely good |

where B/T refers to a ratio of thickness of film deposited at a bottom of a recess to thickness of film deposited on a top surface where the recess is formed, before the recess is filled. Typically, the flowability is evaluated using a wide recess having an aspect ratio of about 1 or less, since generally, the higher the aspect ratio of the recess, the higher the B/T ratio becomes. The B/T ratio generally becomes higher when the aspect ratio of the recess is higher. As used herein, a "flowable" film or material exhibits good or better flowability.

As set forth in more detail below, flowability of film can be temporarily and initially obtained when a volatile hydrocarbon precursor, for example, is polymerized by a plasma and deposits on a surface of a substrate, wherein the gaseous precursor is activated or fragmented by energy provided by plasma gas discharge, so as to initiate polymerization. The resultant polymer material can exhibit temporarily flowable behavior. When a deposition step is complete and/or after a short period of time (e.g., about 3.0 seconds), the film may no longer be flowable at the deposition temperature and pressure, but rather becomes solidified, and thus, a separate solidification process may not be employed. As set forth below, the solidified material may be reflowed using a treatment process.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc., in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 in accordance with examples of the disclosure. Method 100 can be used to deposit a material on a substrate to, e.g., fill one or more recesses on a surface of a substrate.

Method 100 includes the steps of providing a substrate within a reaction chamber (102), depositing material on a surface of the substrate (104), and after depositing a sufficient amount of the deposited material to fill the recess, exposing the deposited material to a post-deposition treatment to cause the deposited material to flow within the recess (106). In accordance with at least some examples of the disclosure, method 100 does not include a cyclical process. Rather, the method includes a single deposition step 104 and a single treatment step 106.

During step 102 of providing a substrate within a reaction chamber, the substrate is provided into a reaction chamber of a gas-phase reactor. In accordance with examples of the disclosure, the reaction chamber can form part of a deposition reactor, such as an atomic layer deposition (ALD) (e.g., PEALD) reactor or chemical vapor deposition (CVD) (e.g., PECVD) reactor. Various steps of methods described herein can be performed (e.g., continuously) within a single reaction chamber or can be performed in multiple reaction chambers, such as reaction chambers of a cluster tool.

During step 102, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be about 50° C. to about 800° C. A pressure within the reaction chamber can be from about 100 Pa to about 1,300 Pa. In accordance with particular examples of the disclosure, the substrate includes one or more features, such as recesses.

During step 104, material is deposited onto a surface of a substrate. In accordance with examples of the disclosure, enough material to fill the one or more recesses is deposited during step 104. The deposit material may solidify and may include one or more voids within a recess of the one or more recesses.

As illustrated, step 104 can include sub steps of flowing a precursor (108) and exposing the precursor to a plasma (110).

During sub step 108, a precursor suitable for forming the deposited material is provided to the reaction chamber. A flowrate of the precursor during step 108 can range from about 100 sccm to about 5,000 sccm. A duration of sub step 108 can range from about 30 seconds to about 6,000 seconds.

Figure 8:
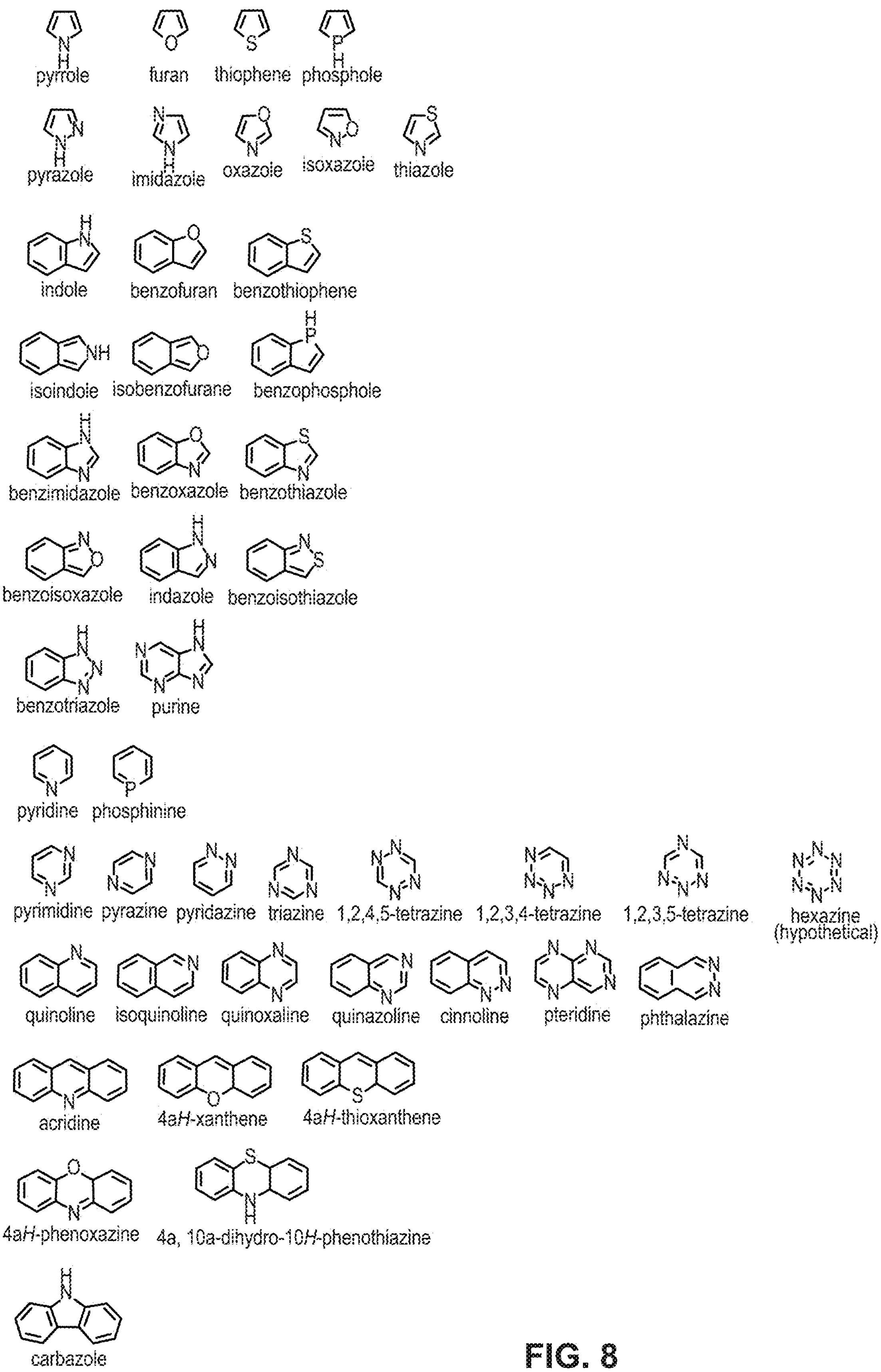
FIG. 8 illustrates exemplary cyclic structures suitable for use as a cyclic structure of a precursor in accordance with examples of the disclosure.

The precursor can include one or more of carbon and silicon. In accordance with various examples of the disclosure, the precursor includes a cyclic structure and/or a carbonyl functional group. Exemplary cyclic structures include the cyclic structure selected from the group consisting of benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; and carbazole. These exemplary cyclic structures are illustrated in FIG. 8. Exemplary carbonyl groups can be selected from one or more of the group consisting of aldehyde, ketone, carboxylic acid, ester, amide, enone, acyl chloride, and acid anhydride. In accordance with further examples of the disclosure, the precursor includes one or more carbonyl groups and one or more of a methyl group, ethyl group, propyl group, butyl group, amine group, and hydroxy group. The precursor can include, for example, 1-6 or 1-4 functional groups attached to a cyclic structure, wherein one or more of the functional groups includes a carbonyl functional group. The carbonyl group can include one or more functional groups—e.g., selected from the group consisting of C1-C6 (e.g., C1-C3) alkane, alkene, or alcohol functional groups. The carbonyl functional group is thought to facilitate reflow of the deposited material during step 106.

During step 110, the precursor is exposed to a (e.g., direct) plasma to cause the precursor to polymerize to thereby become a viscous fluid and to initially solidify on the substrate surface. The plasma power ranges for deposition can range from about 10 W to about 5,000 W. An RF frequency of the plasma power can range from 400 kHz to 100 MHz.

In accordance with examples of the disclosure, steps 108 and 110 overlap. In accordance with further examples, step 110 is shorter in duration than step 108. For example, step 110 can begin after step 108 and/or end before step 108 ends.

During step 106, the material deposited during step 104 can be caused to flow using a treatment. A treatment can include a heat treatment (e.g., raising a temperature of a substrate) and/or a plasma treatment.

In the case of heat treatment, step 106 can include heating the substrate to a temperature of about 50° C. to about 800° C. In some cases, a temperature of a substrate during step 106 can be higher than the temperature of the substrate during step 104. A pressure within the reaction chamber during step 106 can be between about 100 Pa and about 1,300 Pa. In accordance with further examples of the disclosure, an inert gas and/or a nitrogen-containing gas can be provided to the reaction chamber during step 106. Exemplary nitrogen-containing gases include nitrogen, $NH_3$, and $N_2O$. A duration of step 106 can be from about 5 seconds to about 3,000 seconds.

In the case of plasma treatment, step 106 includes forming active species from a gas. The gas can include a nitrogen-containing gas, such as a gas selected from the group consisting of nitrogen, $NH_3$, $N_2O$. The activated species can be formed using, for example, a direct plasma.

A power used to form the plasma can range from about 10 W to about 5000 W. A frequency of the power can range from about 400 kHz to about 100 MHz. A duration of a plasma treatment step can range from about 5 seconds to about 3,000 seconds. A temperature within the reaction chamber during a plasma treatment step can be about 50° C. to about 800° C. or about 30° C. to about 700° C. A pressure within the reaction chamber during a plasma treatment can be between about 100 Pa and about 1,300 Pa.

During steps 104 and/or 106, one or more inert gases, such as argon, helium, nitrogen, or any mixture thereof, can be provided to the reaction chamber (e.g., continuously provided during steps 104 and 106). A flowrate of the inert gas to the reaction chamber during this step can be from about 500 sccm to about 8,000 sccm. The inert gas can be used to facilitate ignition and/or maintenance of a plasma within the reaction chamber, to purge reactants and/or byproducts from the reaction chamber, and/or be used as a carrier gas to assist with delivery of the precursor to the reaction chamber.

Figure 2:
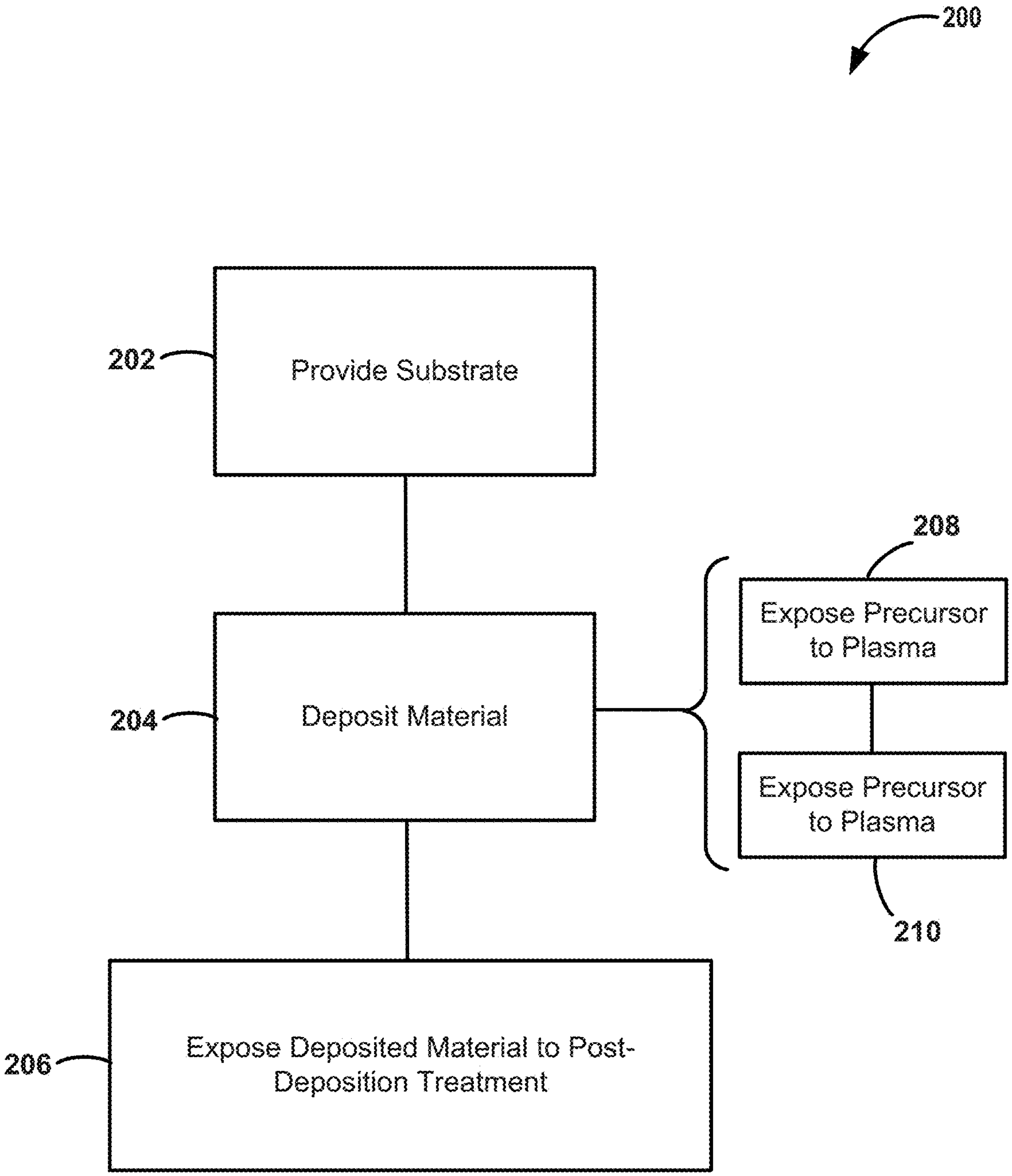
FIG. 2 illustrates another method in accordance with exemplary embodiments of the disclosure.

FIG. 2 illustrates another method 200 in accordance with further examples of the disclosure. Similar to method 100, method 200 can be used to deposit a material on a substrate to, e.g., fill one or more recesses on a surface of a substrate.

Method 200 includes the steps of providing a substrate within a reaction chamber (202), depositing material on a surface of the substrate (204), and exposing the deposited material to a post-deposition treatment to cause the deposited material to flow within the recess (206).

Step 202 can be the same or similar to step 102.

Step 204 includes sub steps 208 and 210. A temperature and pressure within the reaction chamber can be the same or similar to the temperature and pressure described above in connection with step 104.

Sub step 208 can be similar to sub step 108, except sub step 208 includes flowing a precursor that includes a cyclic structure and at least one carbonyl functional group (such a precursor can also be provided during step 108) and step 208 does not necessarily include depositing enough material to fill a recess prior to treatment. Precursors provided during step 208 can also include one or more of carbon and silicon, such that a deposited material includes one or more of carbon, silicon oxide, silicon nitride, and silicon carbide. Precursor flowrates and a duration of step 208 can be the same as or similar to the flowrates and duration of step 108.

Figure 9:
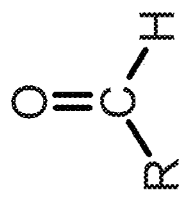
FIG. 9 illustrates exemplary functional groups suitable for use as a carbonyl functional group of a precursor in accordance with examples of the disclosure.
Figure 9:
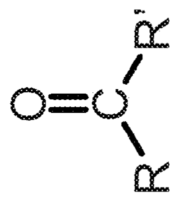
Figure 9:
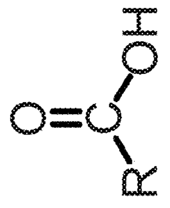
Figure 9:
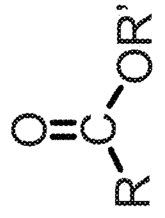
Figure 9:
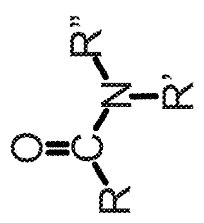
Figure 9:
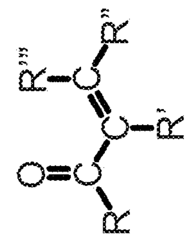
Figure 9:
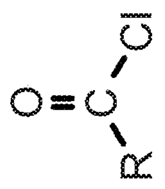
Figure 9:
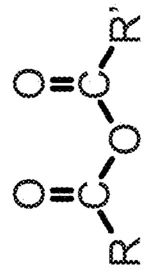

The precursor provided during step 208 includes a cyclic structure and a carbonyl functional group. The cyclic structure can be selected from the group consisting of benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; and carbazole. Such cyclic structures are illustrated in FIG. 8. The carbonyl functional group can be selected from the group consisting of aldehyde, ketone, carboxylic acid, ester, amide, enone, acyl chloride, and acid anhydride. Such functional groups are illustrated in FIG. 9. In accordance with more specific examples of the disclosure, the precursor comprises one or more carbonyl groups and one or more of a methyl group, ethyl group, propyl group, butyl group, amine group, and hydroxy group, such as precursors including functional groups described above.

Sub step 210 can be the same as or similar to sub step 110. A power, duration, temperature and/or pressure during step 210 can be the same or similar to the respective power, duration, temperature and/or pressure noted above with regard to sub step 110.

Step 206 can be the same as or similar to step 106. A power, duration, temperature and/or pressure during step 206 can be the same or similar to the respective power, duration, temperature and/or pressure noted above in connection with step 106.

Figure 4:
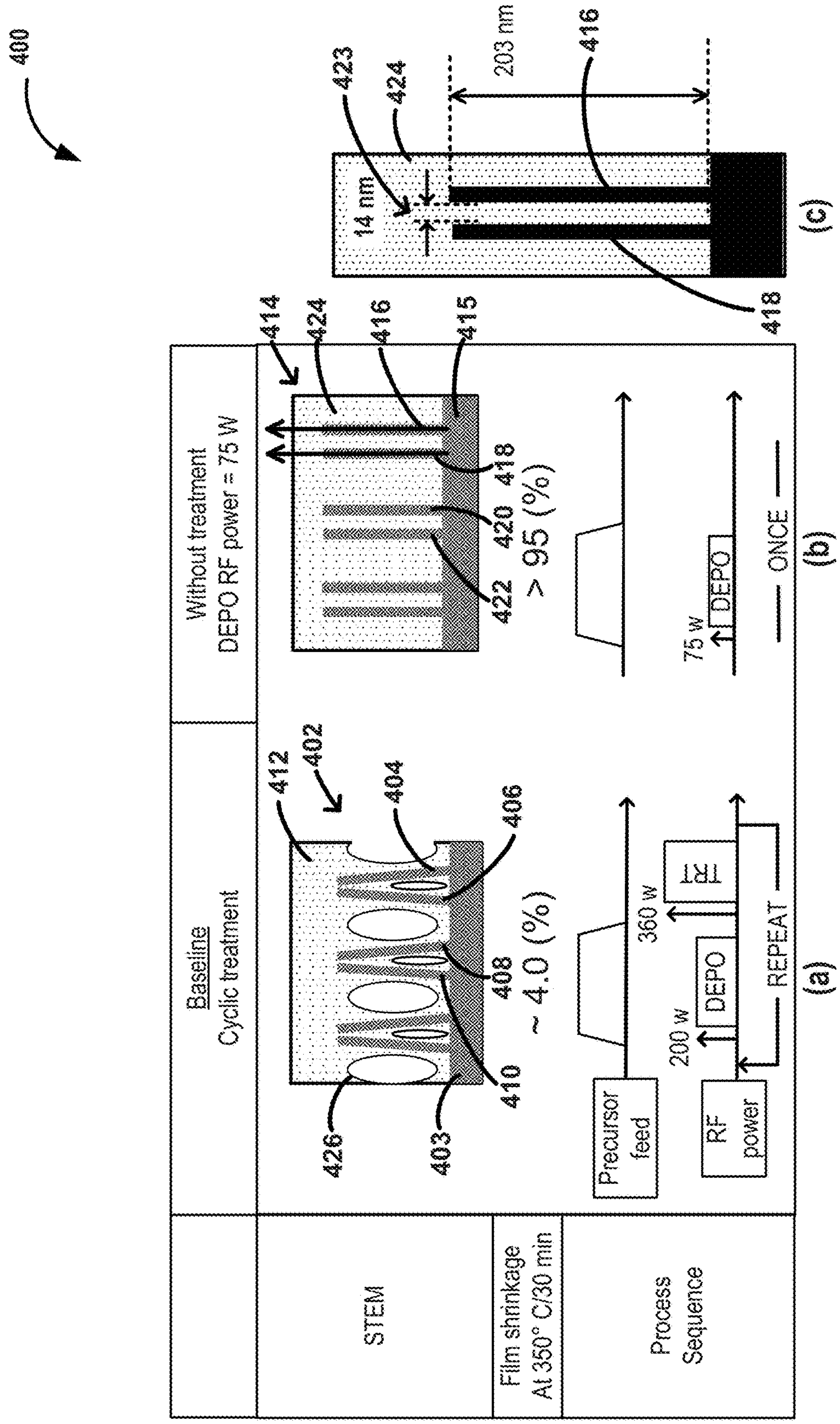
FIG. 4 illustrates an exemplary method and structure in accordance with the disclosure and a comparison of the structure to a structure formed using a method including a cyclic plasma deposition and treatment process.

FIG. 4 illustrates a comparison of a carbon film deposited using a cyclical deposition and treatment process (a), compared to a deposition step (e.g., step 104 or 204) in accordance with examples of the disclosure (b). In the illustrated examples, a structure 402 includes a substrate 403, having protrusions 404-410 formed thereon, and deposited material 412 overlying substrate 403. A structure 414 includes a substrate 415, having protrusions 416-422 formed thereon, and deposited material 424 overlying substrate 415.

As illustrated in FIG. 4, methods that include cyclical deposition and treatment steps can result in void (e.g., void 426) formation at the completion of the process, whereas without the cyclical treatment, no voids may form. Panel (c) illustrates that no voids formed within recess 423, having an aspect ratio of about 14. However, as noted below, in some cases, voids can form during a step of depositing material in accordance with examples of the disclosure. Without a treatment, deposited material 424 may not exhibit desired properties. For example, in the illustrated case, deposited material 424 may exhibit undesirably large shrinkage when exposed to a temperature of about 350° C. for about 30 minutes. The deposited material may also easily evaporate at, for example, temperatures over 200° C. due to the deposited material's low density.

Figure 5:
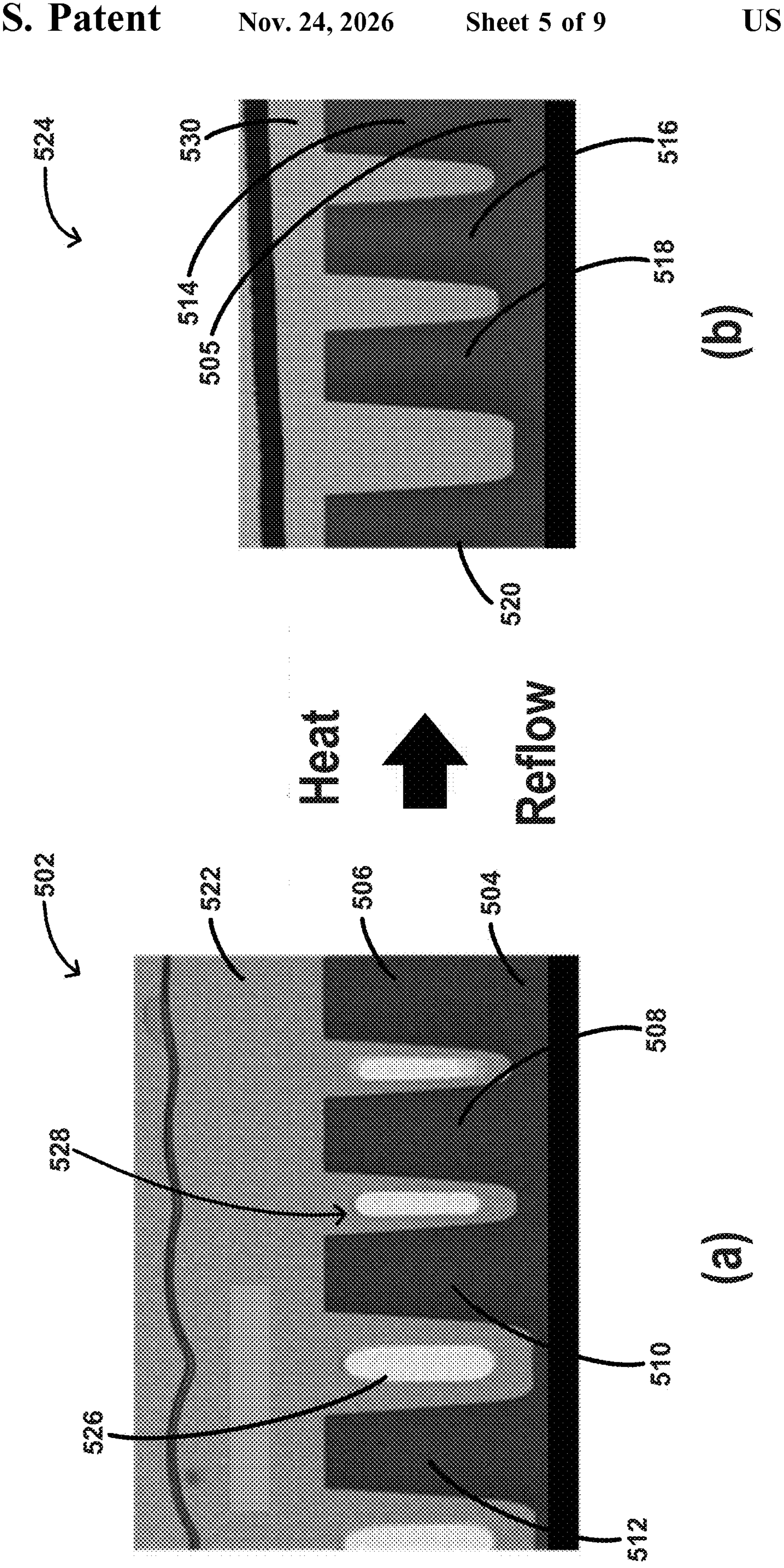
FIG. 5 illustrates structures before and after a heated treatment process in accordance with examples of the disclosure.

FIG. 5 illustrates structure 502 (panel a) and structure 524 (panel b) formed in accordance with further examples of the disclosure. Structure 502 include a substrate 504 and protrusions 506-512 formed thereon. Structure 524 includes a substrate 505 and protrusions 514-520 formed thereon. Structure 502 includes deposited material 522 overlying substrate 504. As illustrated, deposited material 522 includes void 526. After material 522 is deposited (e.g., enough material to fill recesses 528 between protrusions (e.g., protrusions 508, 510)), deposited material 522 is exposed to a post-deposition treatment to cause deposited material 522 to flow within the recess to form structure 524. After treatment, deposited material 522 becomes treated material 530. In the example illustrated in FIG. 5, the post-deposition treatment includes heating substrate 504 to a temperature of about 50° C. to about 800° C. In accordance with further examples of the disclosure, the substrate can be heated to a temperature of about 50° C. to about 800° C. during post-deposition treatment or higher than a substrate temperature during a step of depositing material. Exemplary temperatures, pressures, and environments for the step of heating are noted above.

Figure 6:
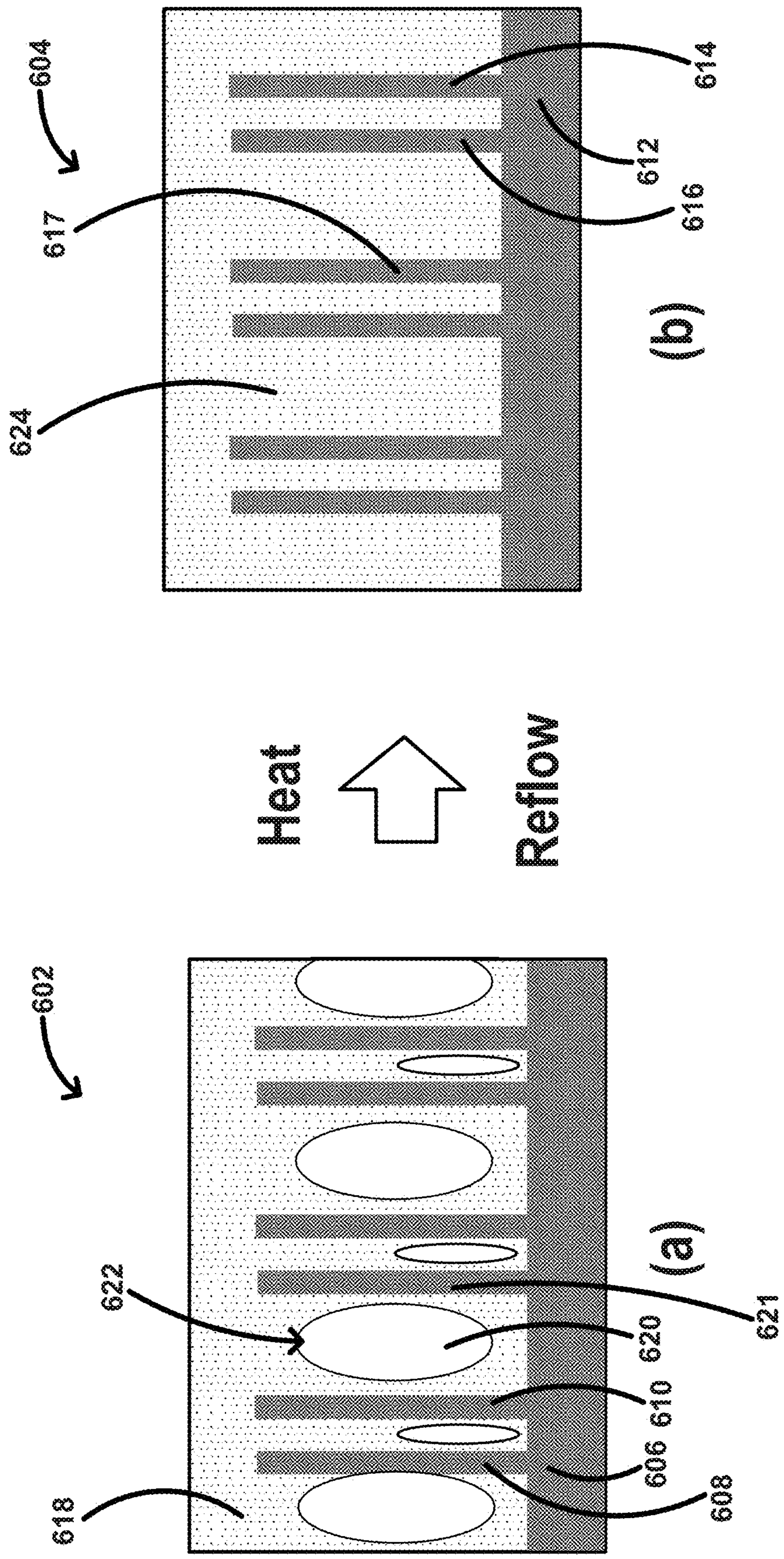
FIG. 6 illustrates structures before and after a heated treatment process in accordance with examples of the disclosure.

FIG. 6 illustrates structure 602 (panel a) and structure 604 (panel b) formed in accordance with further examples of the disclosure. Structure 602 includes a substrate 606 and high-aspect ratio protrusions 608, 610, 621 formed thereon. Structure 604 includes a substrate 612 and protrusions 614, 616, 617 formed thereon. Structure 602 includes deposited material 618 overlying substrate 606. As illustrated, deposited material 618 includes a void 620 formed within a recess 622 between protrusions 610 and 621. After material 618 is deposited (e.g., enough material to fill recess 622), deposited material 618 is exposed to a post-deposition treatment to cause deposited material 618 to flow within recess 622 to form structure 604, which includes treated material 624. FIG. 6 is similar to FIG. 5, except structures 602 and 604 include higher aspect ratio features, compared to structures 502, 524.

Figure 7:
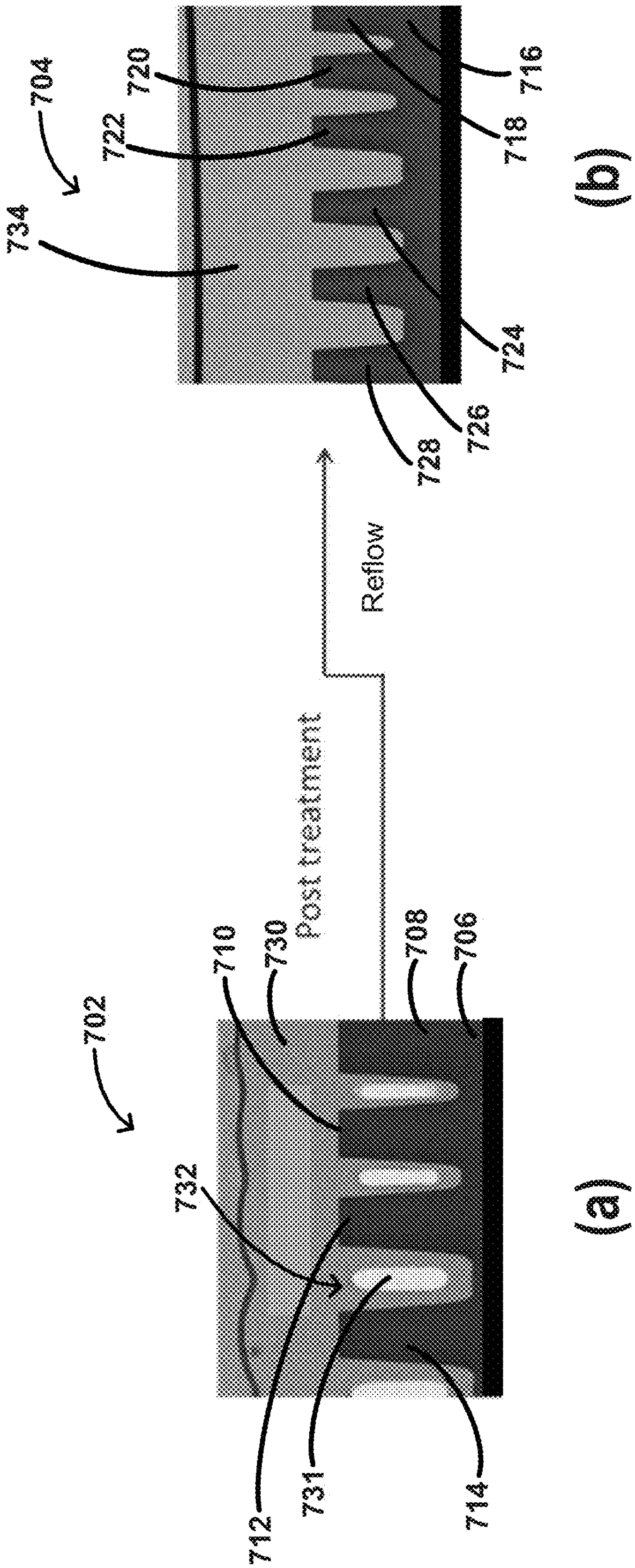
FIG. 7 illustrates structures before and after a plasma treatment process in accordance with examples of the disclosure.

FIG. 7 illustrates additional structures 702, 704 in accordance with examples of the disclosure. Structure 702 includes a substrate 706 and protrusions 708-714 formed thereon. Structure 704 includes a substrate 716 and protrusions 718-728 formed thereon. Structure 702 includes deposited material 730 overlying substrate 706. As illustrated, deposited material 730 includes void 731. After material 730 is deposited (e.g., enough material to fill a recess 732 between protrusions (e.g., protrusions 712, 714)), deposited material 730 is exposed to a post-deposition treatment to cause deposited material 730 to flow within recesses (e.g., recess 732) to form structure 704. After treatment, deposited material 730 becomes treated material 734. In this case, the post-deposition treatment includes a plasma treatment. During the plasma treatment, the substrate can be heated to a temperature that is about the same (e.g., within about 10° C.) of the substrate temperature during the step of depositing material or about 50° C. to about 800° C. higher than a substrate temperature during a step of depositing material. Exemplary temperatures, pressures, and environments for plasma treatment are noted above.

Figure 3:
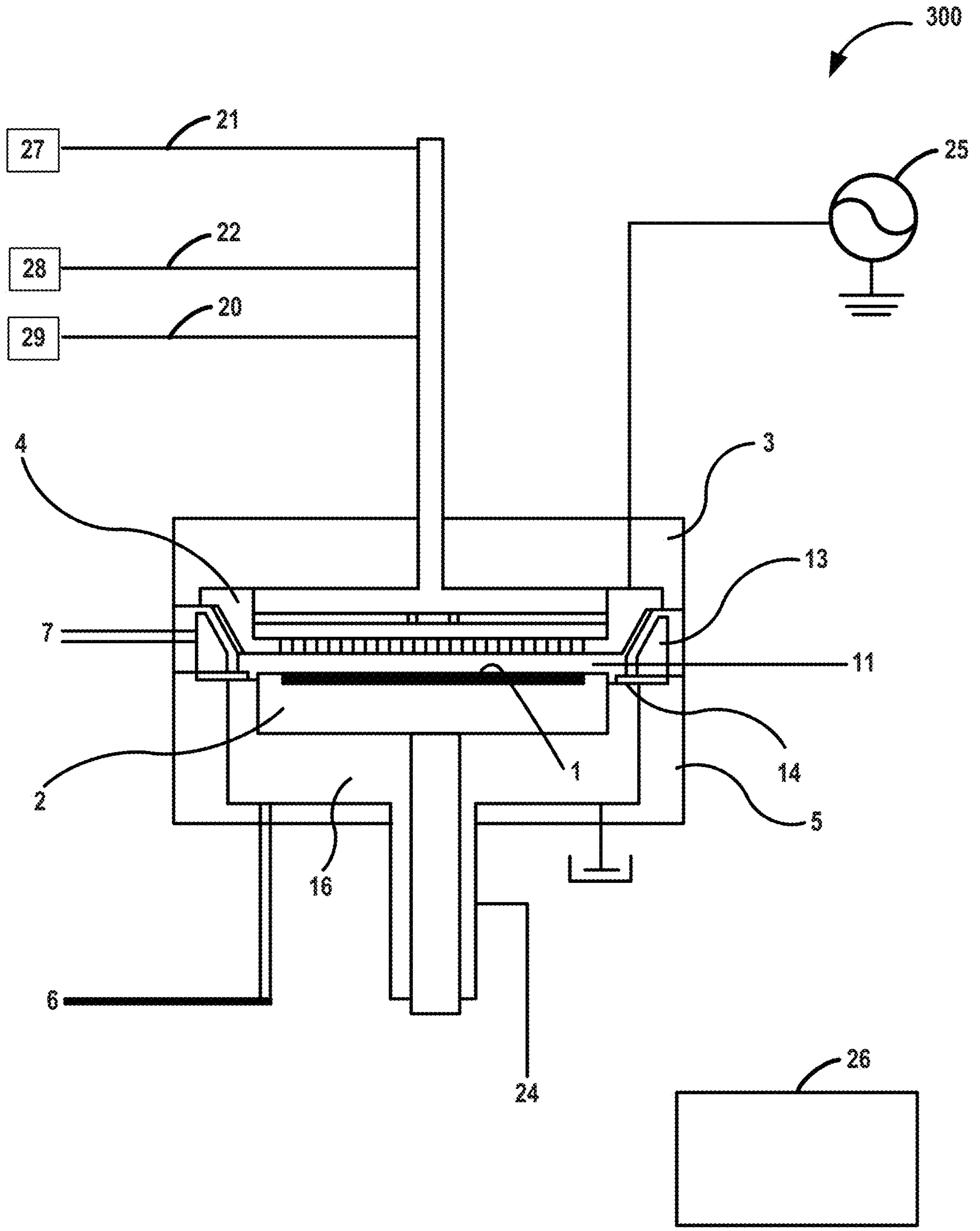
FIG. 3 illustrates a system in accordance with exemplary embodiments of the disclosure.

FIG. 3 illustrates a reactor system 300 in accordance with exemplary embodiments of the disclosure. Reactor system 300 can be used to perform one or more methods, steps or sub steps as described herein and/or to form one or more structures or portions thereof as described herein.

Reactor system 300 includes a pair of electrically conductive flat-plate electrodes 4, 2 in parallel and facing each other in the interior 11 (reaction zone) of a reaction chamber 3. A plasma can be excited within reaction chamber 3 by applying, for example, HRF power (e.g., 13.56 MHz or 27 MHz) from power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. Electrode 4 can serve as a gas distribution device, such as a shower plate. Reactant gas, dilution gas, if any, precursor gas, and/or the like can be introduced from a source 27, 28, and/or 29 into reaction chamber 3 using one or more of a gas line 20, a gas line 21, and a gas line 22, respectively, and through the shower plate 4. Although illustrated with three gas lines, reactor system 800 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition and treatment steps are performed in the same reaction space, so that two or more (e.g., all) of the steps can continuously be conducted without exposing the substrate to air or other oxygen-containing atmosphere.

In some embodiments, continuous flow of an inert or carrier gas to reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor gas in pulses by switching between the main line and the detour line, without substantially fluctuating pressure of the reaction chamber.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan. By way of example, controller 26 can be configured to perform the depositing, exposing, and post-deposition treatment steps of a method described herein.

In some embodiments, a dual chamber reactor (two sections or compartments for processing wafers disposed close to each other) can be used, wherein an inert gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of filling a recess on a surface of a substrate, the method comprising the steps of:

providing a substrate within a reaction chamber;

depositing initially flowable material on a surface of the substrate, wherein the step of depositing comprises:

flowing a precursor into the reaction chamber; and exposing the precursor to a plasma to form a deposited material; and after depositing a sufficient amount of the deposited material to fill the recess, exposing the sufficient amount of the deposited material to fill the recess to a post-deposition treatment to cause the deposited material to reflow within the recess, wherein the deposited material comprises one or more of carbon, silicon oxide, silicon nitride, and silicon carbide, wherein the precursor comprises a cyclic structure and a carbonyl functional group bonded to the cyclic structure and a carbon atom, and wherein a substrate temperature during the post-deposition treatment is higher than a substrate temperature during the step of depositing.

2. The method of claim 1, wherein the step of depositing is not a cyclical process.

3. The method of claim 1, wherein the deposited material includes voids and wherein the post-deposition treatment reduces an amount of the voids after the deposited material has flowed.

4. The method of claim 3, wherein the post-deposition treatment comprises heating the substrate to a temperature of about 50° C. to about 800° C.

5. The method of claim 1, wherein the post-deposition treatment comprises a plasma treatment.

6. The method of claim 5, wherein the post-deposition plasma treatment comprises exposing a nitrogen-containing gas to a plasma.

7. The method of claim 6, wherein the nitrogen-containing gas is selected from the group consisting of nitrogen, $NH_3$, $N_2O$.

8. The method of claim 5, wherein a pressure within the reaction chamber is between about 100 Pa and about 1,300 Pa.

9. The method of claim 1, wherein the cyclic structure is selected from the group consisting of benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; and carbazole.

10. The method of claim 1, wherein the precursor comprises one or more of a methyl group, ethyl group, propyl group, butyl group, amine group, and hydroxy group.

11. The method of claim 10, wherein the precursor comprises the methyl group and the hydroxy group.

12. The method of claim 1, wherein the carbonyl functional group is a ketone functional group.

13. A method of filling a recess on a surface of a substrate, the method comprising the steps of:

providing a substrate within a reaction chamber;

depositing an initially flowable material on a surface of the substrate, wherein the step of depositing comprises:

flowing a precursor into the reaction chamber; and exposing the precursor to a plasma to form a deposited material, wherein the steps of flowing the precursor and exposing the precursor to the plasma overlap; and exposing the deposited material to a post-deposition treatment to cause the deposited material to reflow within the recess, wherein the deposited material comprises one or more of carbon, silicon oxide, silicon nitride, and silicon carbide, wherein the precursor comprises a cyclic structure and at least one carbonyl functional group, wherein the at least one carbonyl functional group is a ketone that is bonded to the cyclic structure, and wherein a substrate temperature during the post-deposition treatment is higher than a substrate temperature during the step of depositing.

14. The method of claim 13, wherein the cyclic structure is selected from the group consisting of benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; and carbazole.

15. The method of claim 13, wherein the precursor comprises one or more of a methyl group, ethyl group, propyl group, butyl group, amine group, and hydroxy group.

16. The method of claim 13, wherein the post-deposition treatment comprises one or more of heating the substrate and exposing the deposited material to excited species.

17. The method of claim 16, wherein the excited species are formed by exposing an inert gas and/or a nitrogen-containing gas to a plasma.

18. A system for depositing a material to fill recesses on a surface of a substrate, the system comprising:

a reaction chamber; and a controller to perform the depositing, exposing, and post-deposition treatment steps of claim 1.

* * * * *